(12) United States Patent
Luniewski et al.

(10) Patent No.: US 12,438,068 B2
(45) Date of Patent: Oct. 7, 2025

(54) STACKED MODULE ARRANGEMENT

(71) Applicant: Infineon Technologies Austria AG, Villach (AT)

(72) Inventors: Peter Luniewski, Poing (DE); Ivan Nikitin, Regensburg (DE); Bernd Schmoelzer, Radenthein (AT)

(73) Assignee: Infineon Technologies Austria AG, Villach (AT)

( * ) Notice: Subject to any disclaimer, the term of this patent is extended or adjusted under 35 U.S.C. 154(b) by 793 days.

(21) Appl. No.: 17/577,879

(22) Filed: Jan. 18, 2022

(65) Prior Publication Data

US 2023/0230905 A1    Jul. 20, 2023

(51) Int. Cl.
| | |
|---|---|
| *H01L 23/495* | (2006.01) |
| *H01L 23/055* | (2006.01) |
| *H01L 23/31* | (2006.01) |
| *H01R 12/58* | (2011.01) |
| *H01R 12/70* | (2011.01) |

(52) U.S. Cl.
CPC ...... *H01L 23/49568* (2013.01); *H01L 23/055* (2013.01); *H01L 23/3114* (2013.01); *H01R 12/585* (2013.01); *H01R 12/7064* (2013.01); *H05K 2201/1059* (2013.01)

(58) Field of Classification Search
CPC ............. H01L 23/49568; H01L 23/055; H01L 23/3114; H01R 12/585; H01R 12/7064; H05K 2201/1059
See application file for complete search history.

(56) References Cited

U.S. PATENT DOCUMENTS

| | | | | |
|---|---|---|---|---|
| 5,946,545 | A * | 8/1999 | Bertin | G11C 29/808 |
| | | | | 257/E21.526 |
| 6,137,163 | A * | 10/2000 | Kim | H01L 23/24 |
| | | | | 438/109 |
| 6,664,616 | B2 * | 12/2003 | Tsubosaki | H01L 23/49572 |
| | | | | 257/679 |
| 7,091,592 | B2 * | 8/2006 | Chen | H01L 25/0657 |
| | | | | 257/737 |
| 7,791,177 | B2 | 9/2010 | Wieneke Kessler et al. | |
| 7,829,991 | B2 * | 11/2010 | Moden | H01L 25/105 |
| | | | | 438/109 |
| 8,102,670 | B2 * | 1/2012 | Sakamoto | H05K 7/1432 |
| | | | | 361/792 |
| 8,116,100 | B2 * | 2/2012 | Saen | H01L 24/73 |
| | | | | 361/803 |

(Continued)

FOREIGN PATENT DOCUMENTS

| | | |
|---|---|---|
| DE | 102006032436 A1 | 1/2008 |
| DE | 112015000660 T5 | 12/2016 |

(Continued)

*Primary Examiner* — Eugene Lee
(74) *Attorney, Agent, or Firm* — Murphy, Bilak & Homiller, PLLC

(57) ABSTRACT

A stacked module arrangement includes: a first molded electronic module; a second molded electronic module; and an interface by which the first molded electronic module and the second molded electronic module are physically and electrically connected to one another in a stacked configuration. The first molded electronic module is a power electronic module having a maximum breakdown voltage of at least 40V and a maximum DC current of at least 10 A.

20 Claims, 14 Drawing Sheets

(56) References Cited

U.S. PATENT DOCUMENTS

| | | | |
|---|---|---|---|
| 8,130,499 B2* | 3/2012 | Ohnishi | H01L 23/3735 174/16.3 |
| 8,194,411 B2* | 6/2012 | Leung | H01L 24/96 361/761 |
| 9,536,816 B2 | 1/2017 | Kessler et al. | |
| 10,304,788 B1 | 5/2019 | Kim et al. | |
| 10,790,220 B2 | 9/2020 | Saklang et al. | |
| 11,652,078 B2 | 5/2023 | Cabatbat et al. | |
| 11,901,273 B2 | 2/2024 | Nikitin et al. | |
| 2004/0145880 A1 | 7/2004 | Watanabe et al. | |
| 2005/0035434 A1 | 2/2005 | Fissore et al. | |
| 2006/0043545 A1 | 3/2006 | Yea et al. | |
| 2006/0208350 A1* | 9/2006 | Poo | H01L 23/49805 257/692 |
| 2008/0094793 A1* | 4/2008 | Sakurai | H01L 25/18 361/679.01 |
| 2008/0122075 A1* | 5/2008 | Bauer | H01L 24/48 257/E23.08 |
| 2008/0283983 A1 | 11/2008 | Obara | |
| 2009/0146272 A1 | 6/2009 | Wieneke et al. | |
| 2010/0127383 A1 | 5/2010 | Oka et al. | |
| 2012/0014059 A1 | 1/2012 | Zeng et al. | |
| 2012/0187554 A1 | 7/2012 | Oka et al. | |
| 2012/0306091 A1 | 12/2012 | Stolze et al. | |
| 2012/0320545 A1 | 12/2012 | Lo Presti et al. | |
| 2015/0380274 A1 | 12/2015 | Yoshimatsu et al. | |
| 2016/0118314 A1 | 4/2016 | Ko | |
| 2016/0143187 A1 | 5/2016 | Sekino | |
| 2017/0345792 A1 | 11/2017 | Tanimoto | |
| 2017/0365533 A1* | 12/2017 | Cho | H01L 29/778 |
| 2018/0083304 A1* | 3/2018 | Horibe | H01M 4/485 |
| 2019/0157177 A1* | 5/2019 | Ichimura | H01L 23/50 |
| 2021/0202439 A1 | 7/2021 | Wu et al. | |
| 2021/0398887 A1 | 12/2021 | Niendorf et al. | |
| 2023/0026022 A1 | 1/2023 | Nikitin et al. | |
| 2023/0121335 A1 | 4/2023 | Nikitin et al. | |
| 2024/0404926 A1 | 12/2024 | Chi et al. | |

FOREIGN PATENT DOCUMENTS

| | | |
|---|---|---|
| DE | 112016002302 T5 | 3/2018 |
| JP | 2016154258 A | 8/2016 |
| JP | 2019140175 A | 8/2019 |
| WO | 2016185920 A1 | 11/2016 |
| WO | 2021214504 A1 | 10/2021 |

* cited by examiner

STACKED MODULE ARRANGEMENT

BACKGROUND

Molded power semiconductor modules are used in a wide range of power electronic applications, including inverters, converters, rectifiers, motor control, etc. Parallel connection of two or more molded modules increases the x/y (lateral) dimensions on the system PCB (printed circuit board). Several molded modules or packages are soldered/placed on a PCB to realize power electronic systems, increasing the PCB size. Side-by-side arrangement of molded modules may allow for enhanced cooling. However, enhanced cooling may not be required or possible for some applications. For example, power electronic arrangement in a washing machine or airplane application do not require or cannot accommodate enhanced cooling. In applications where enhanced cooling is not required or cannot be accommodated, a side-by-side arrangement of molded modules results in an unnecessary increase in PCB size which increases overall system cost.

Accordingly, there is a need for a more efficient molded power semiconductor module arrangement for applications that do not require or cannot accommodate enhanced cooling afforded by a side-by-side module arrangement.

SUMMARY

According to an embodiment of a stacked module arrangement, the stacked module arrangement comprises: a first molded electronic module; a second molded electronic module; and an interface by which the first molded electronic module and the second molded electronic module are physically and electrically connected to one another in a stacked configuration, wherein the first molded electronic module is a power electronic module having a maximum breakdown voltage of at least 40V and a maximum DC current of at least 10 A.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a stacked arrangement of molded electronic modules that occupies less board space compared to a side-by-side module arrangement. Two or more molded electronic modules may be stacked on one another in a vertical arrangement such that the x/y (lateral) dimensions of the system board to which the stacked module arrangement is attached do not need to be increased to accommodate the molded electronic modules. The board may be attached to either side of the stacked module arrangement or interposed between two molded electronic modules included in the stacked module arrangement. In other applications, the board may be omitted or more than one board may be used.

The molded electronic modules included in the stacked module arrangement may include components such as power devices like power transistors and/or power diodes, e.g., for switching a load current, inverting or converting a voltage, rectifying an alternating current, etc., logic devices such as a gate driver for a power transistor, a controller for a gate driver, etc., sensors, passive devices such as capacitors, inductors, transformers, etc. Still other types of devices used in power electronic applications may be included in the molded electronic modules. In each case, the molded electronic modules are physically and electrically connected to one another in a stacked configuration via an interface and at least one of the molded electronic modules is a power electronic module having a maximum breakdown voltage of at least 40V and a maximum DC current of at least 10 A.

Described next, with reference to the figures, are exemplary embodiments of the stacked module arrangement.

Figure 1:
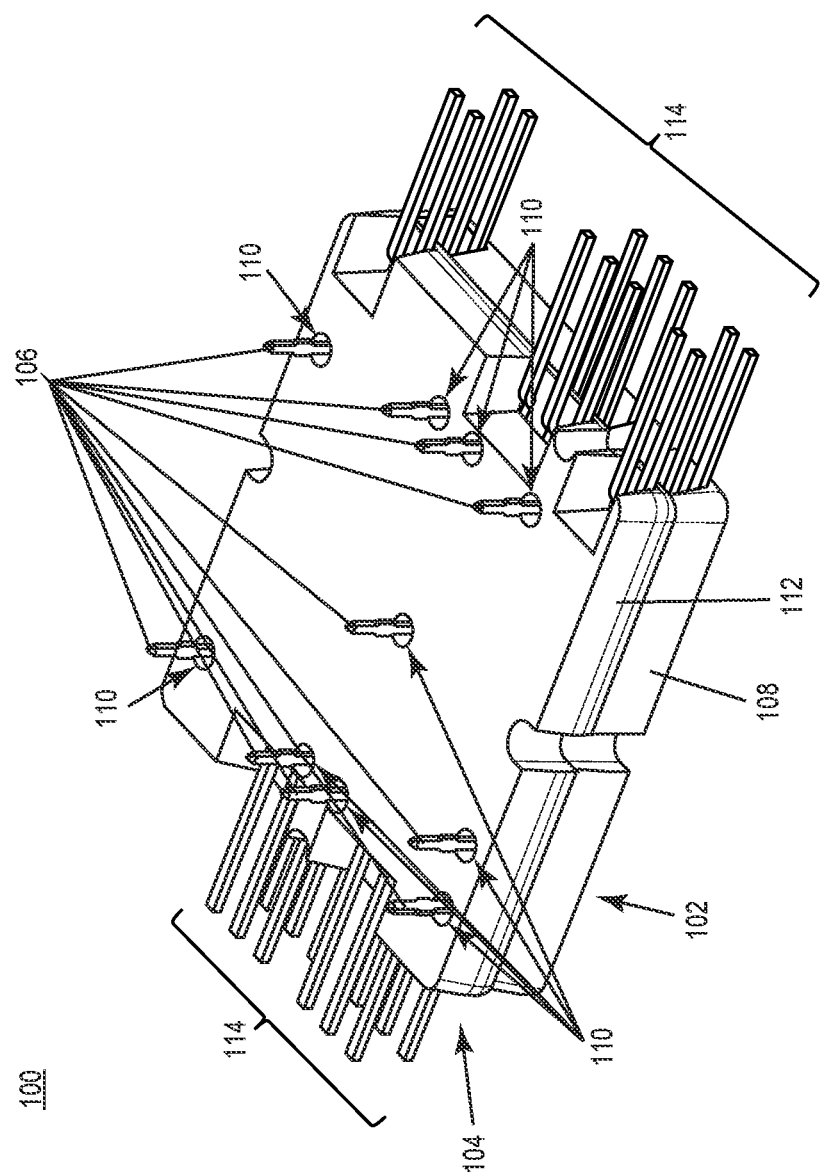
FIG. 1 illustrates a side perspective view of an embodiment of a stacked module arrangement.

FIG. 1 illustrates an embodiment of a stacked module arrangement 100. The stacked module arrangement 100 includes a first molded electronic module 102 and a second molded electronic module 104. The stacked module arrangement 100 may include more than two molded electronic modules 102, 104. As explained above, the molded electronic modules 102, 104 may include components such as power devices like power transistors and/or power diodes, e.g., for switching a load current, inverting or converting a voltage, rectifying an alternating current, etc., logic devices such as a gate driver for a power transistor, a controller for a gate driver, etc., sensors, passive devices such as capacitors, inductors, transformers, etc. Still other types of devices used in power electronic applications may be included in the molded electronic modules 102, 104.

The stacked module arrangement 100 also includes an interface by which the molded electronic modules 102, 104 are physically and electrically connected to one another in a stacked configuration. According to the embodiment illustrated in FIG. 1, the interface is a press-fit interface that comprises press-fit connectors 106 protruding through a molded body 108 of the first molded electronic module 102 and received by corresponding openings 110 in a molded body 112 of the second molded electronic module 104. The molded bodies 108, 112 may be formed by placing the components of the respective electronic modules 102, 104 in a chamber and injecting liquified encapsulant material into the chamber. Examples of such techniques include injection molding, transfer molding, compression molding, and film-assist molding. In another embodiment, the molded bodies 108, 112 may be formed by a lamination technique.

The press-fit connectors 106 of the vertical (stacked) interface may be securely retained to a metal region of a substrate within the second molded electronic module 104 and enable an electrical connection with one or more semiconductor dies and/or passive components included in the second molded electronic module 104. At least some of the press-fit connectors 106 may extend through the molded body 112 of the second molded electronic module 104 to provide a connection interface at a side of the second molded electronic module facing away from the first molded electronic module 102, thereby enabling a press-fit connection between the stacked module arrangement 100 and a receiving apparatus such as a PCB (not shown in FIG. 1). The molded electronic modules 102, 104 may each have leads 114 protruding through the corresponding molded body 108, 112 for providing respective electrical interfaces to the molded electronic modules 102, 104.

According to the embodiment illustrated in FIG. 1, the first molded electronic module 102 is a power electronic module having a maximum breakdown voltage of at least 40V and a maximum DC current of at least 10 A. For example, the first molded electronic module 102 may have a maximum breakdown voltage of at least 80V and a DC operating current in a range of 10 A to 400 A. The first molded electronic module 102 may be used in 750V and/or 1200V applications, for example. In each case, the first molded electronic module 102 is a power module and not a logic or IC (integrated circuit) module. The second molded electronic module 104 may or may not be a power module. For example, the second molded electronic module 104 may include passive components, sensors, a controller such as a microcontroller, electronic circuits, etc.

In one embodiment, the second molded electronic module 104 also is a power electronic module having a maximum breakdown voltage of at least 40V and a maximum DC current of at least 20 A. According to this embodiment, the first and second molded electronic modules 102, 104 may form a power converter or inverter circuit. For example, in the case of a half bridge configuration, the first molded electronic module 102 may include a first half-bridge, the second molded electronic module 104 may include a second half-bridge, the first half-bridge and the second half-bridge may be stacked on one another via the vertical (stacked) interface of the stacked module arrangement 100, and the vertical (stacked) interface may enable a half bridge switching node connection between the power transistor modules. The module leads 114 may provide a ground connection as well as control and other signalling.

In another embodiment, the first molded electronic module 102 includes a power transistor die such as an IGBT (insulated gate bipolar transistor) die, a Si power MOSFET (metal-oxide semiconductor) die, a SiC power transistor die, a GaN HEMT (high-electron mobility transistor) die, etc., the second molded electronic module 104 includes a diode die, and the vertical (stacked) interface of the stacked module arrangement 100 electrically connects the diode die and the power transistor die in an anti-parallel configuration.

In another embodiment, the first molded electronic module 102 includes a power converter or inverter and the second molded electronic module 104 includes a controller for the power converter or inverter.

In another embodiment, the first molded electronic module 102 includes a power converter or inverter and the second molded electronic module 104 includes a rectifier and/or PFC (power factor correction) stage. For example, the second molded electronic module 104 may include a totem pole type rectifier.

In another embodiment, the second molded electronic module 104 is a logic module that includes a controller and/or a gate driver for the first molded electronic module 102.

In another embodiment, the first molded electronic module 102 includes a rectifier and PFC stage and the second molded electronic module 104 includes an inverter or PFC only.

In general, one or both of the molded electronic modules 102, 104 may be part of a larger circuit, e.g., multi-level or even single switches composing a half-bridge with other stacked modules. One or both of the molded electronic modules 102, 104 may be implemented as a parallel connection of the same type of module.

Figure 2:
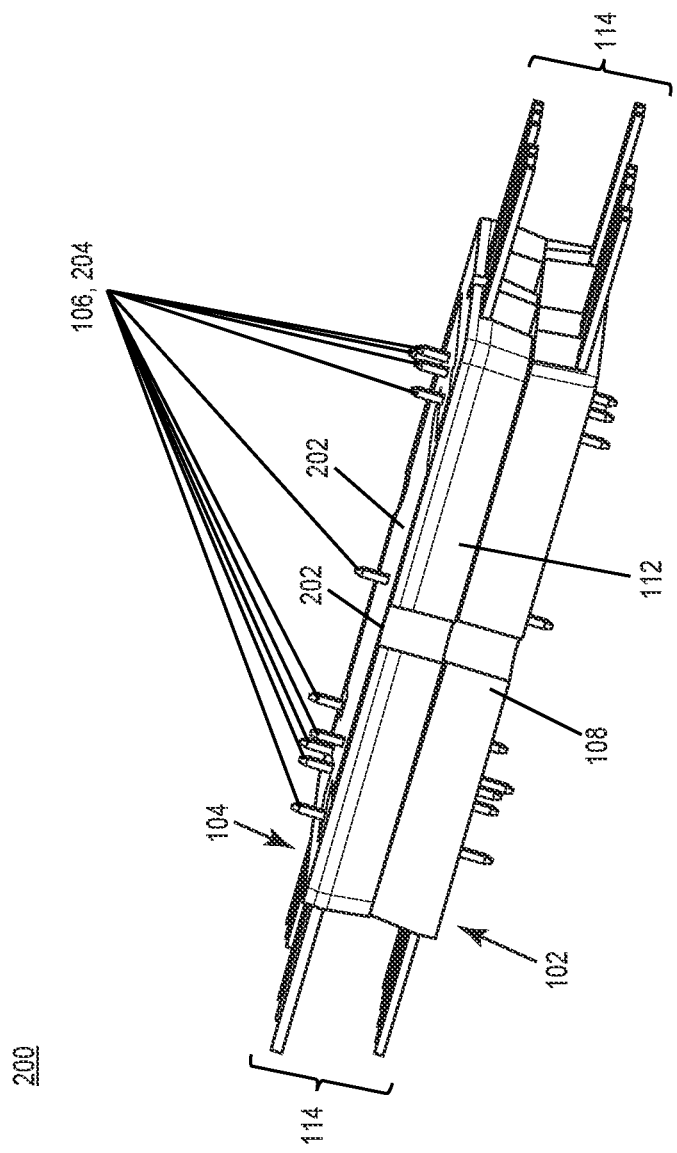
FIG. 2 illustrates a side perspective view of another embodiment of a stacked module arrangement.

FIG. 2 illustrates another embodiment of a stacked module arrangement 200. The embodiment illustrated in FIG. 2 is similar to the embodiment illustrated in FIG. 1. In FIG. 2, one or more bus bars 202 are connected to a connection interface 204 formed by a part of the press-fit connectors 106 that extend through the molded body 112 of the second molded electronic module 104 at the opposite side as the first molded electronic module 102. Each bus bar 202 is a metallic strip or bar configured for high current power distribution.

Figure 3:
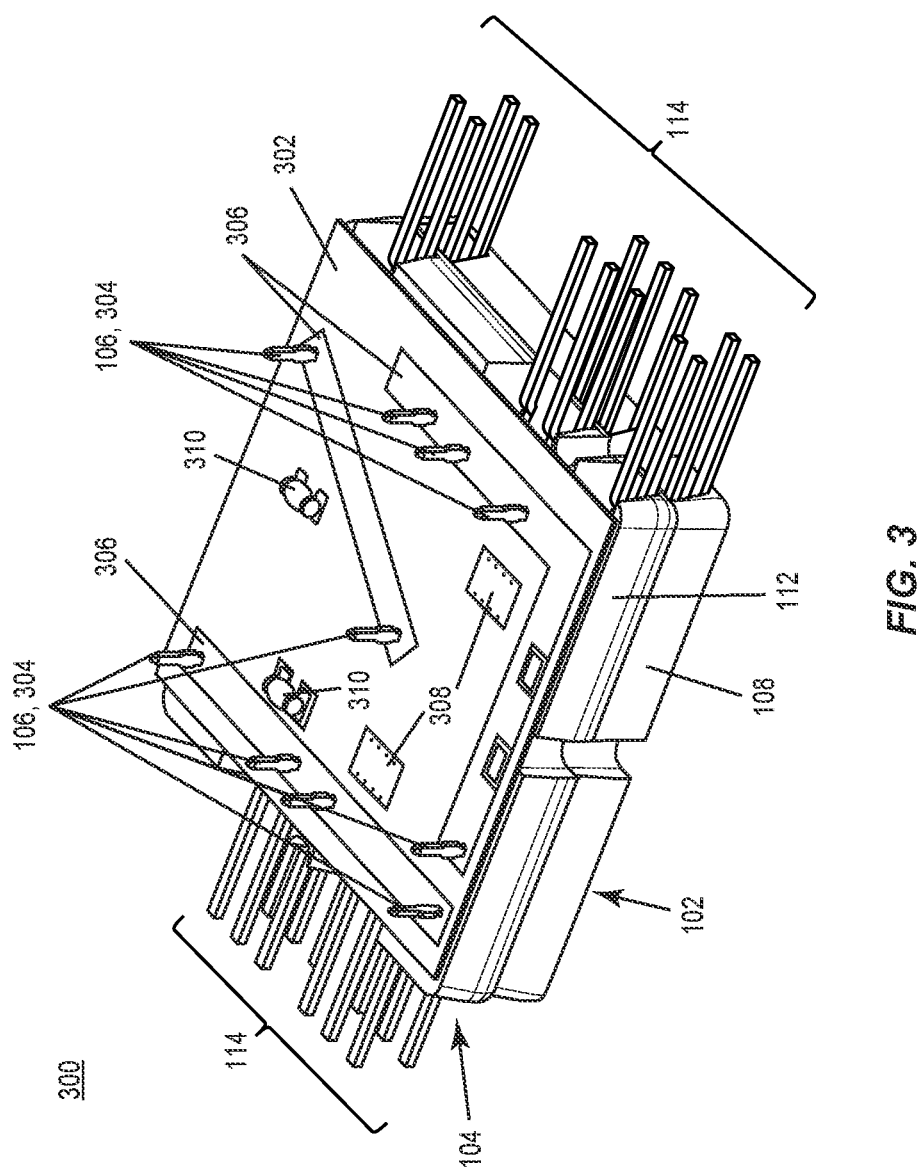
FIG. 3 illustrates a top perspective view of another embodiment of a stacked module arrangement.

FIG. 3 illustrates another embodiment of a stacked module arrangement 300. The embodiment illustrated in FIG. 3 is similar to the embodiment illustrated in FIG. 1. In FIG. 3, a circuit board 302 is connected to a connection interface 304 formed by the press-fit connectors 106 that extend through the molded body 112 of the second molded electronic module 104 at the opposite side as the first molded electronic module 102. The circuit board 302 may be a single-layer or multi-layer PCB, for example. The circuit board 302 may include metal traces 306, electronic devices 308 such as active and/or passive semiconductor dies, passive components 310 such as capacitors, inductors, etc.

Figure 4A:
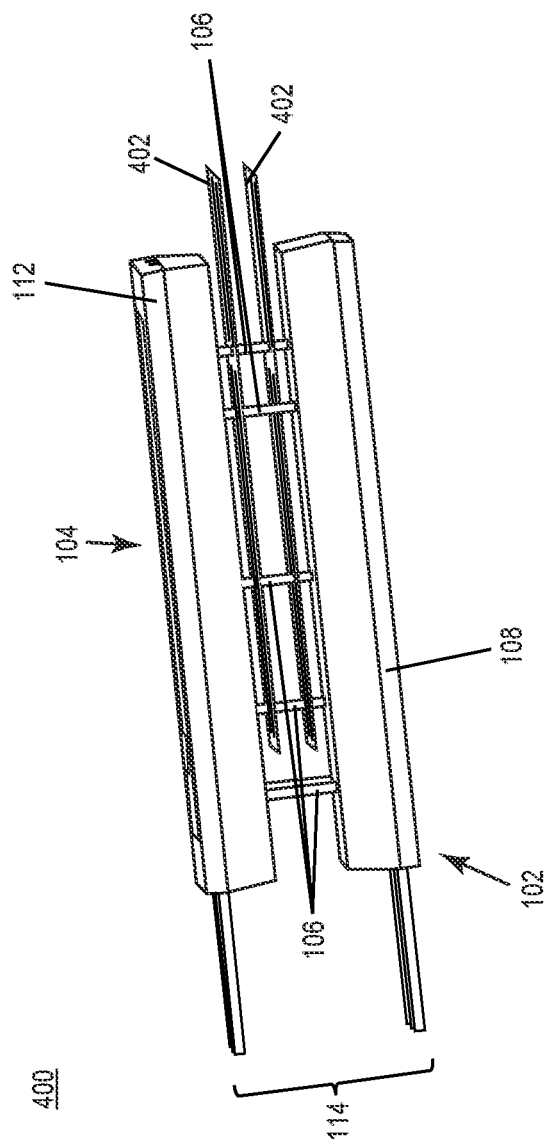
FIG. 4A illustrates a side perspective view of another embodiment of a stacked module arrangement.
Figure 4B:
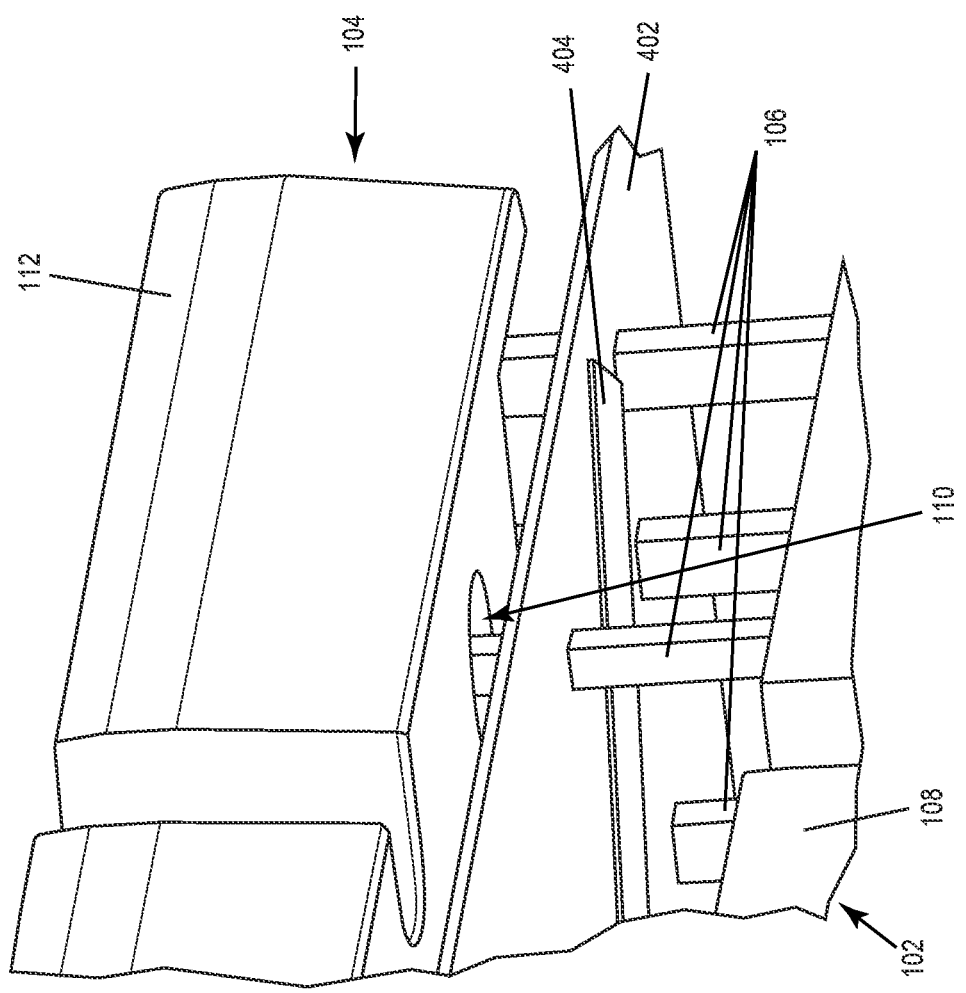
FIG. 4B illustrates an enlarged view of one part of the stacked module arrangement shown in FIG. 4A.

FIG. 4A illustrates another embodiment of a stacked module arrangement 400. The embodiment illustrated in FIG. 4A is similar to the embodiment illustrated in FIG. 1. In FIG. 4A, at least one circuit board 402 is interposed between the first molded electronic module 102 and the second molded electronic module 104. At least some of the press-fit connectors 106 of the vertical (stacked) interface extend through the circuit board(s) 402 and into the molded body 112 of the second molded electronic module 104. FIG. 4B illustrates an enlarged view of one part of the stacked module arrangement 400. Each circuit board 402 may have metal traces 404 and other components one or both sides of the board 402. In one embodiment, both the first molded electronic module 102 and the second molded electronic module 104 are power electronic modules each having a maximum breakdown voltage of at least 40V and a maximum DC current of at least 10 A, and together form a power converter or inverter circuit where the circuit board 402 includes a gate driver and/or controller for the power electronic modules.

Figure 5:
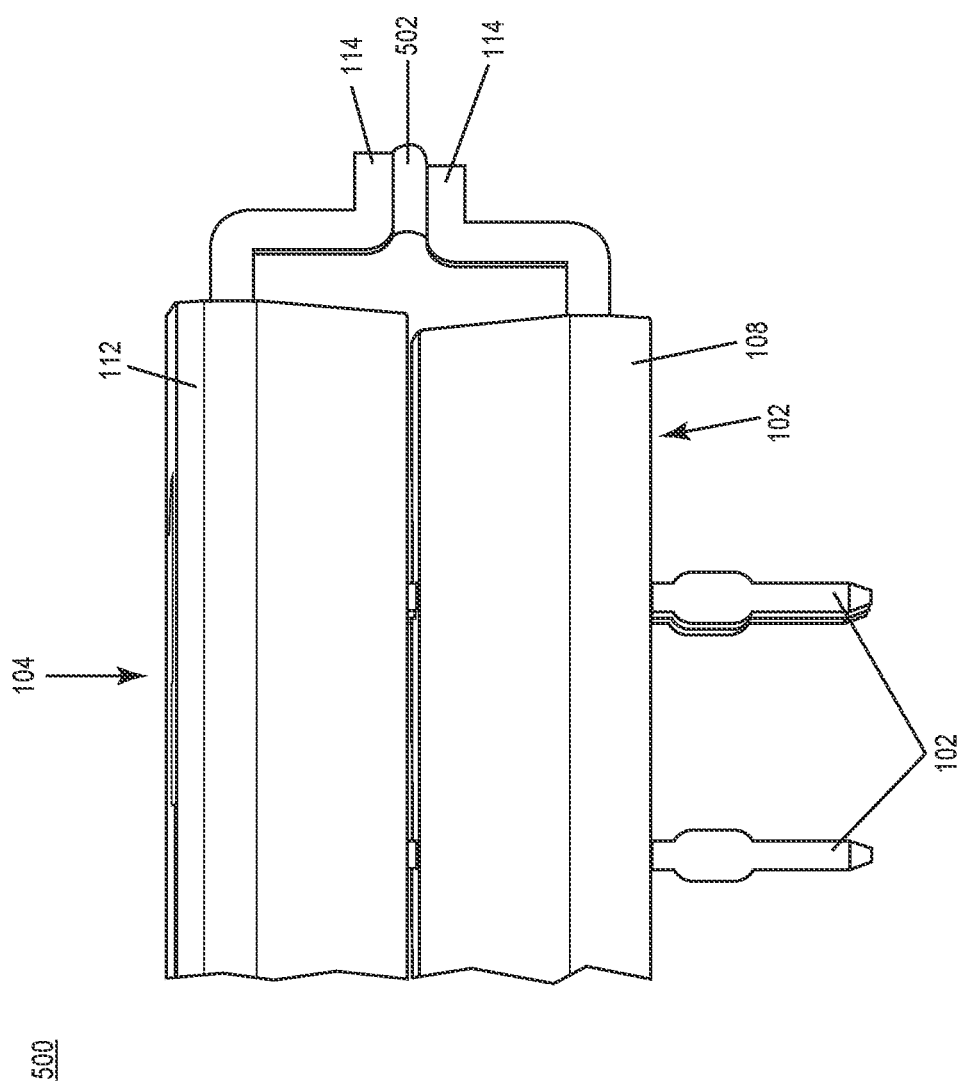
FIG. 5 illustrates a partial side view of another embodiment of a stacked module arrangement.

FIG. 5 illustrates another embodiment of a stacked module arrangement 500. The embodiment illustrated in FIG. 5 is similar to the embodiment illustrated in FIG. 1. In FIG. 5, the vertical (stacked) interface includes a solder joint 502 between at least some of the leads 114 of the molded electronic modules 102, 104.

Figure 6:
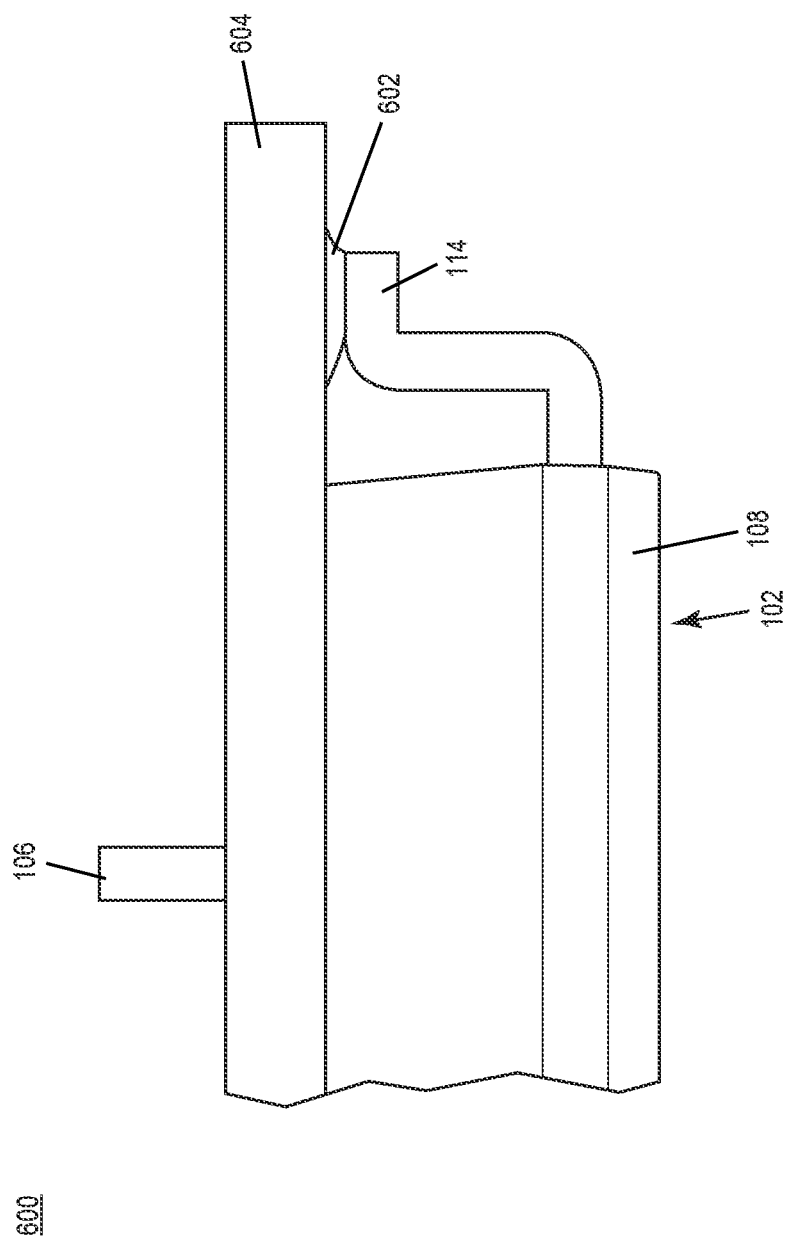
FIG. 6 illustrates a partial side view of another embodiment of a stacked module arrangement.

FIG. 6 illustrates another embodiment of a stacked module arrangement 600. The embodiment illustrated in FIG. 6 is similar to the embodiment illustrated in FIG. 5. In FIG. 6, a solder joint 602 is formed between leads 114 of the first molded electronic module 102 and a bus bar 604. The second molded electronic module 104 is not shown in FIG. 6 but may be similarly soldered to the bus bar 604 at the opposite side as the first molded electronic module 102. The press-fit connectors 106 of the vertical (stacked) interface pass through openings (out of view) in the bus bar 604 and into the openings 110 formed in the molded body 112 of the second molded electronic module 104. In one embodiment, both the first molded electronic module 102 and the second molded electronic module 104 are power electronic modules each having a maximum breakdown voltage of at least 40V and a maximum DC current of at least 10 A, and together form a power converter or inverter circuit where the bus bar 604 carries a phase or load current or implements a +DC or −DC terminal of the power converter or inverter circuit.

Figure 7:
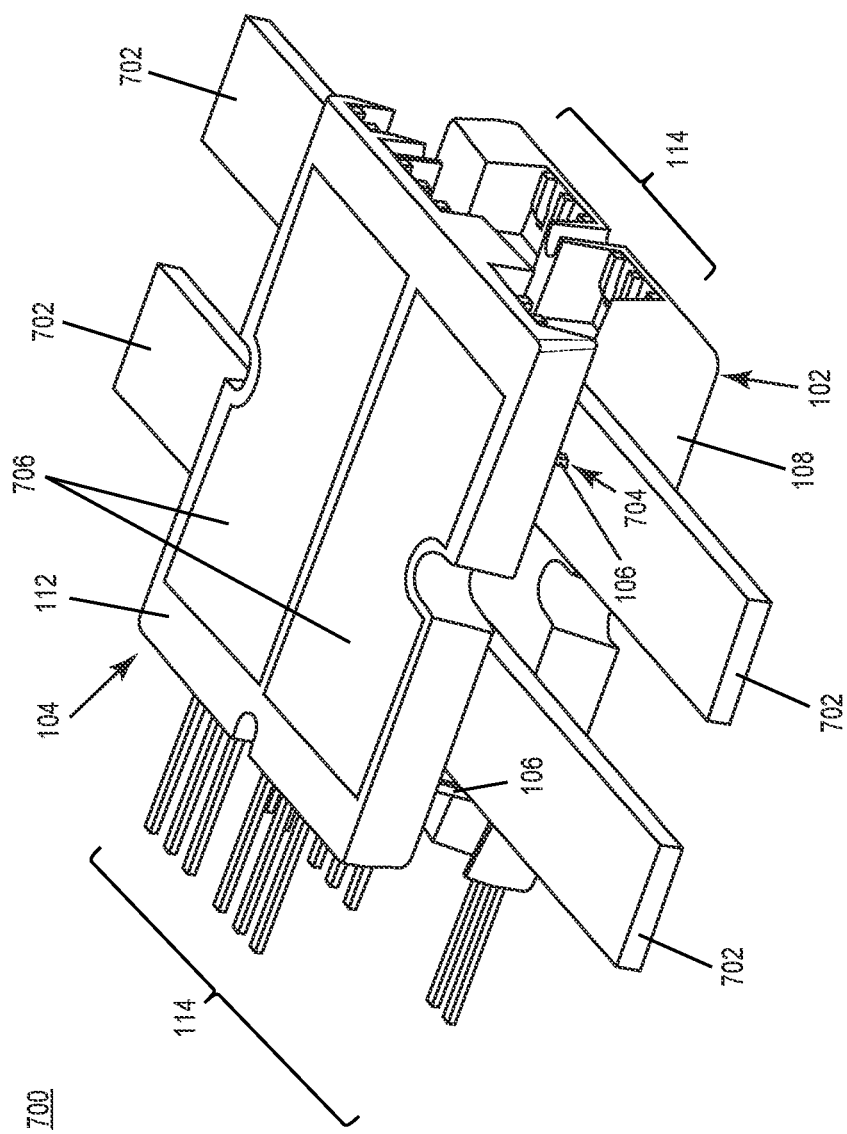
FIG. 7 illustrates a top perspective view of another embodiment of a stacked module arrangement.

FIG. 7 illustrates another embodiment of a stacked module arrangement 700. The embodiment illustrated in FIG. 7 is similar to the embodiment illustrated in FIGS. 4A and 4B. In FIG. 7, at least one bus bar 702 is connected to the vertical (stacked) interface and interposed between the molded electronic modules 102, 104. At least some of the press-fit connectors 106 of the vertical (stacked) interface pass through openings 704 in each bus bar 702 and into the molded body 112 of the second molded electronic module 104. Other ones of the press-fit connectors 106 may be outside the region of the bus bar(s) 702 and pass directly into the molded body 112 of the second molded electronic module 104 without passing through a bus bar 702.

In one embodiment, both the first molded electronic module 102 and the second molded electronic module 104 are power electronic modules each having a maximum breakdown voltage of at least 40V and a maximum DC current of at least 10 A, and together form a power converter or inverter circuit where each bus bar 702 carries a phase or load current or implements a +DC or −DC terminal of the power converter or inverter circuit. As shown in FIG. 7, the outward facing side of each molded electronic module 102, 104 may have an exposed metal surface 706 which may be part of a metallized substrate, metal clip, leadframe, etc. embedded in the corresponding molded body 108, 112. In this case, enhanced cooling may be provided at this side of the molded electronic modules 102, 104

Figure 8:
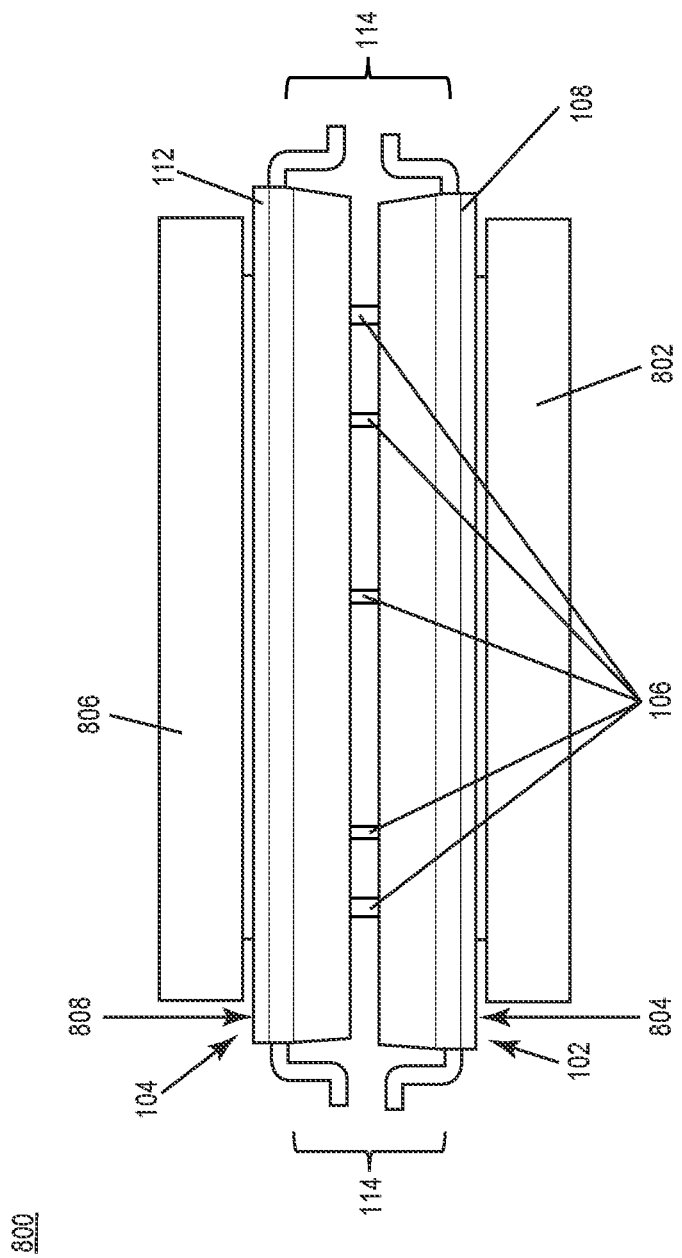
FIG. 8 illustrates a side view of another embodiment of a stacked module arrangement.

FIG. 8 illustrates another embodiment of a stacked module arrangement 800. The embodiment illustrated in FIG. 8 is similar to the embodiment illustrated in FIG. 1. In FIG. 8, a first cooling device 802 is thermally coupled to a side 804 of the first molded electronic module 102 facing away from the vertical (stacked) interface. A second cooling device 806 is thermally coupled to a side 808 of the second molded electronic module 104 facing away from the vertical (stacked) interface. The cooling devices 802, 806 may be air-cooled or liquid-cooled heat sinks, for example.

Figure 9:
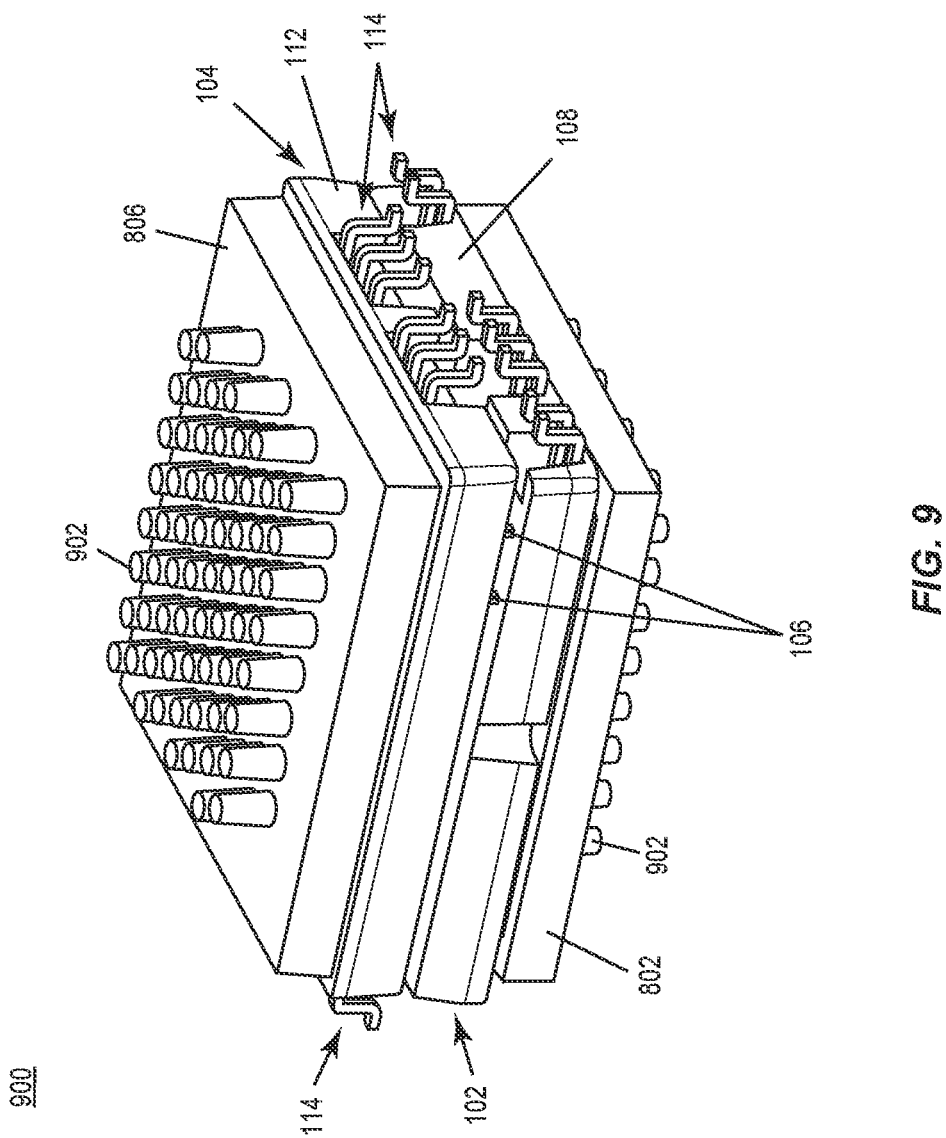
FIG. 9 illustrates a top perspective view of another embodiment of a stacked module arrangement.

FIG. 9 illustrates another embodiment of a stacked module arrangement 900. The embodiment illustrated in FIG. 9 is similar to the embodiment illustrated in FIG. 8. In FIG. 9, one or both cooling devices 802, 806 may include fins 902 for enhanced heat dissipation.

Figure 10:
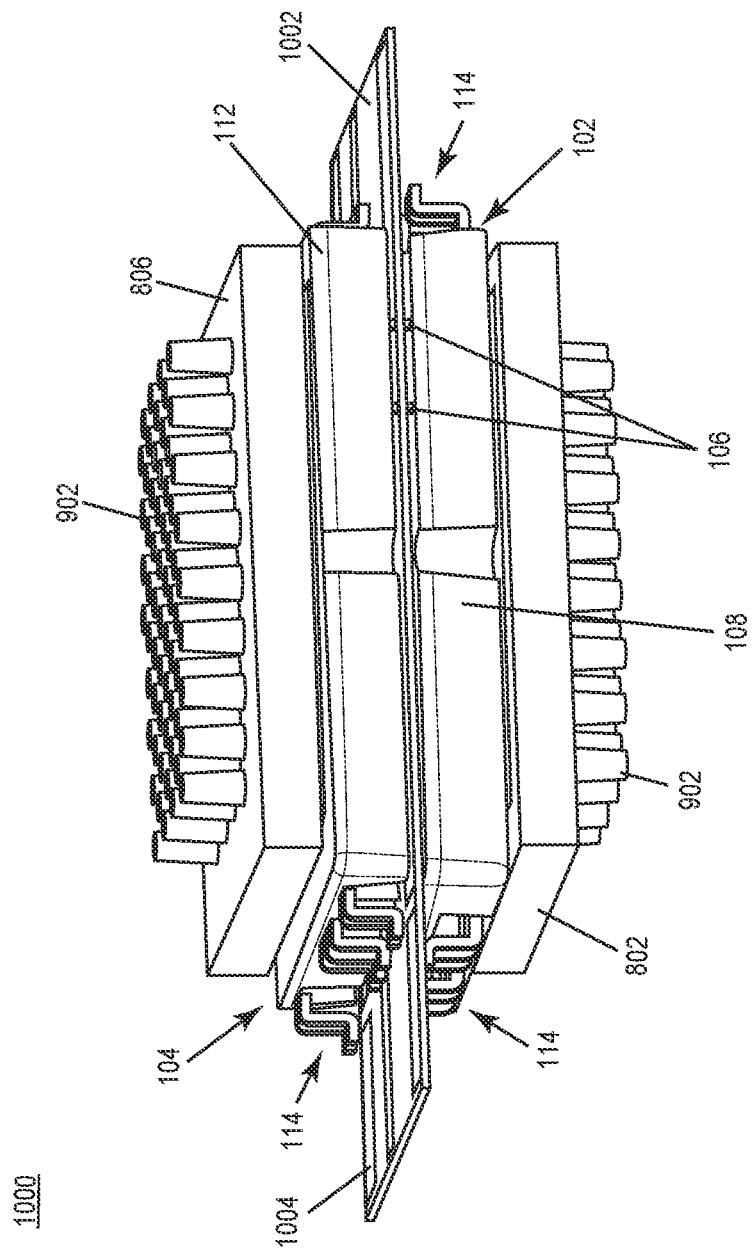
FIG. 10 illustrates a side perspective view of another embodiment of a stacked module arrangement.

FIG. 10 illustrates another embodiment of a stacked module arrangement 1000. The embodiment illustrated in FIG. 10 is similar to the embodiment illustrated in FIGS. 4A, 4B and 9. In FIG. 10, a circuit board 1002 is interposed between the molded electronic modules 102, 104. At least some of the press-fit connectors 106 of the vertical (stacked) interface extend through the circuit board 1002 and into the molded body 112 of the second molded electronic module 104. The circuit board 1002 may have metal traces 1004 and other components one or both sides of the board 1002. In one embodiment, the circuit board 1002 provides power and control signals to one or both of the molded electronic modules 102, 104.

Figure 11:
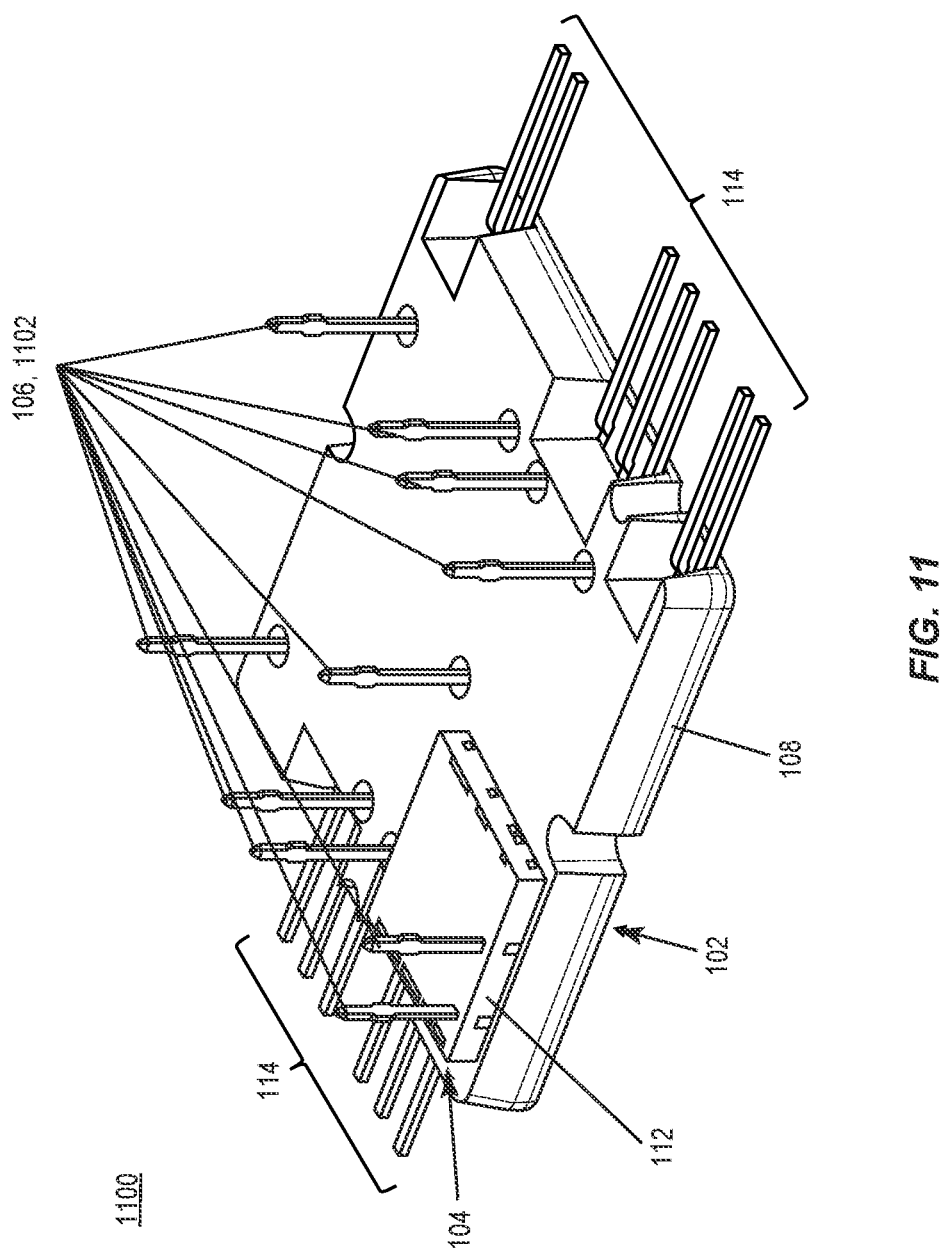
FIG. 11 illustrates a top perspective view of another embodiment of a stacked module arrangement.

FIG. 11 illustrates another embodiment of a stacked module arrangement 1100. The embodiment illustrated in FIG. 11 is similar to the embodiment illustrated in FIG. 1. In FIG. 11, the second molded electronic module 104 is a logic module that includes a controller and/or a gate driver for the first molded electronic module 102. At least some of the press-fit connectors 106 of the vertical (stacked) interface may extend through the molded body 112 of the second molded electronic module 104 to provide a connection interface 1102 at a side of the second molded electronic module facing away from the first molded electronic module 102, thereby enabling a press-fit connection between the stacked module arrangement 1100 and a receiving apparatus such as a PCB (not shown in FIG. 11). Other ones of the press-fit connectors 106 may be outside the region of the second molded electronic module 104 and pass directly to the receiving apparatus as part of the connection interface 1102.

Figure 12:
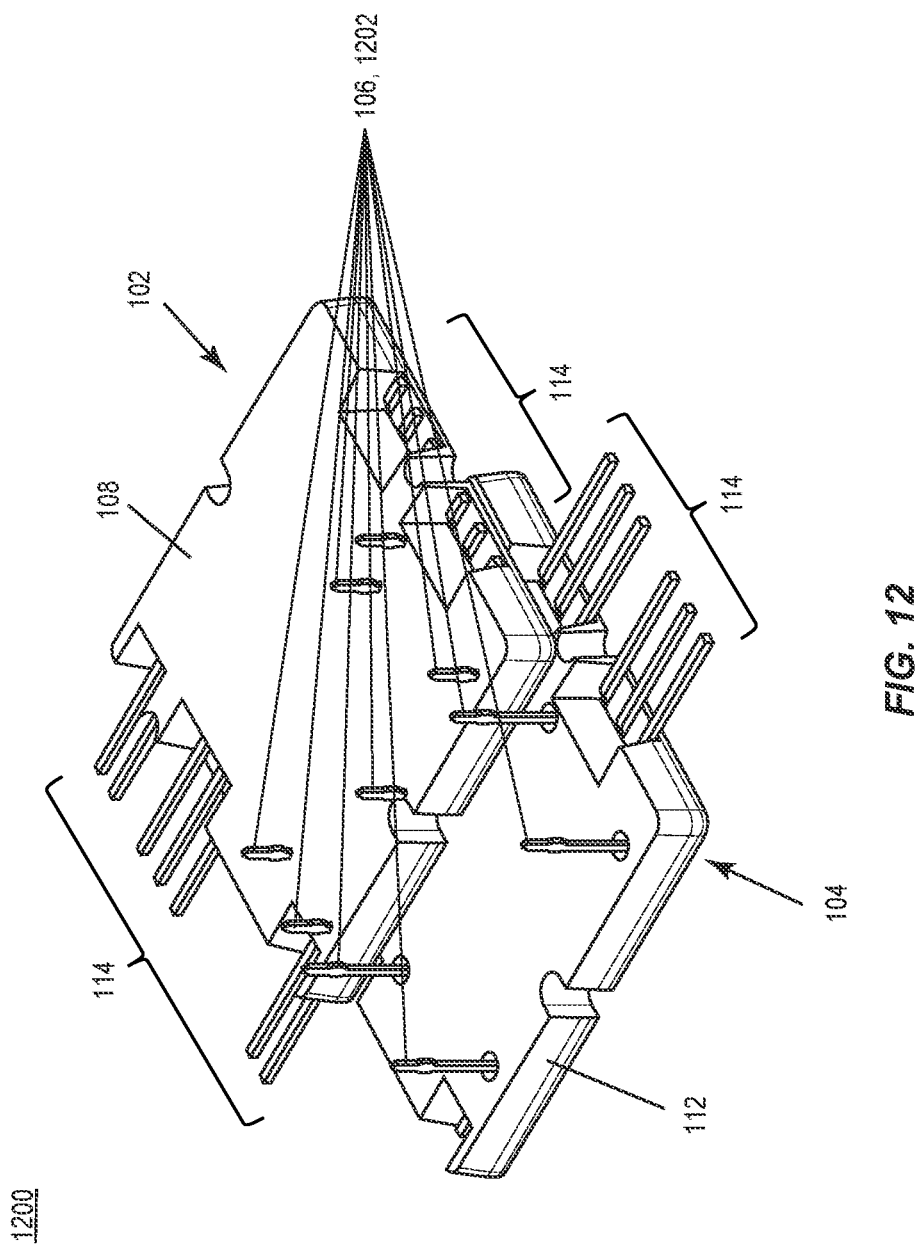
FIG. 12 illustrates a top perspective view of another embodiment of a stacked module arrangement.

FIG. 12 illustrates another embodiment of a stacked module arrangement 1200. The embodiment illustrated in FIG. 12 is similar to the embodiment illustrated in FIG. 1. In FIG. 12, the first molded electronic module 102 overhangs the second molded electronic module 104 such that part of the second molded electronic module 104 is not covered by the first molded electronic module 102. At least some of the press-fit connectors 106 of the vertical (stacked) interface may extend through the molded body 108 of the first molded electronic module 102 to provide a connection interface 1202 at a side of the first molded electronic module facing away from the second molded electronic module 104, thereby enabling a press-fit connection between the stacked module arrangement 1200 and a receiving apparatus such as a PCB (not shown in FIG. 11). Other ones of the press-fit connectors 106 may be outside the region of the first molded electronic module 102 and pass directly to the receiving apparatus as part of the connection interface 1202.

Figure 13:
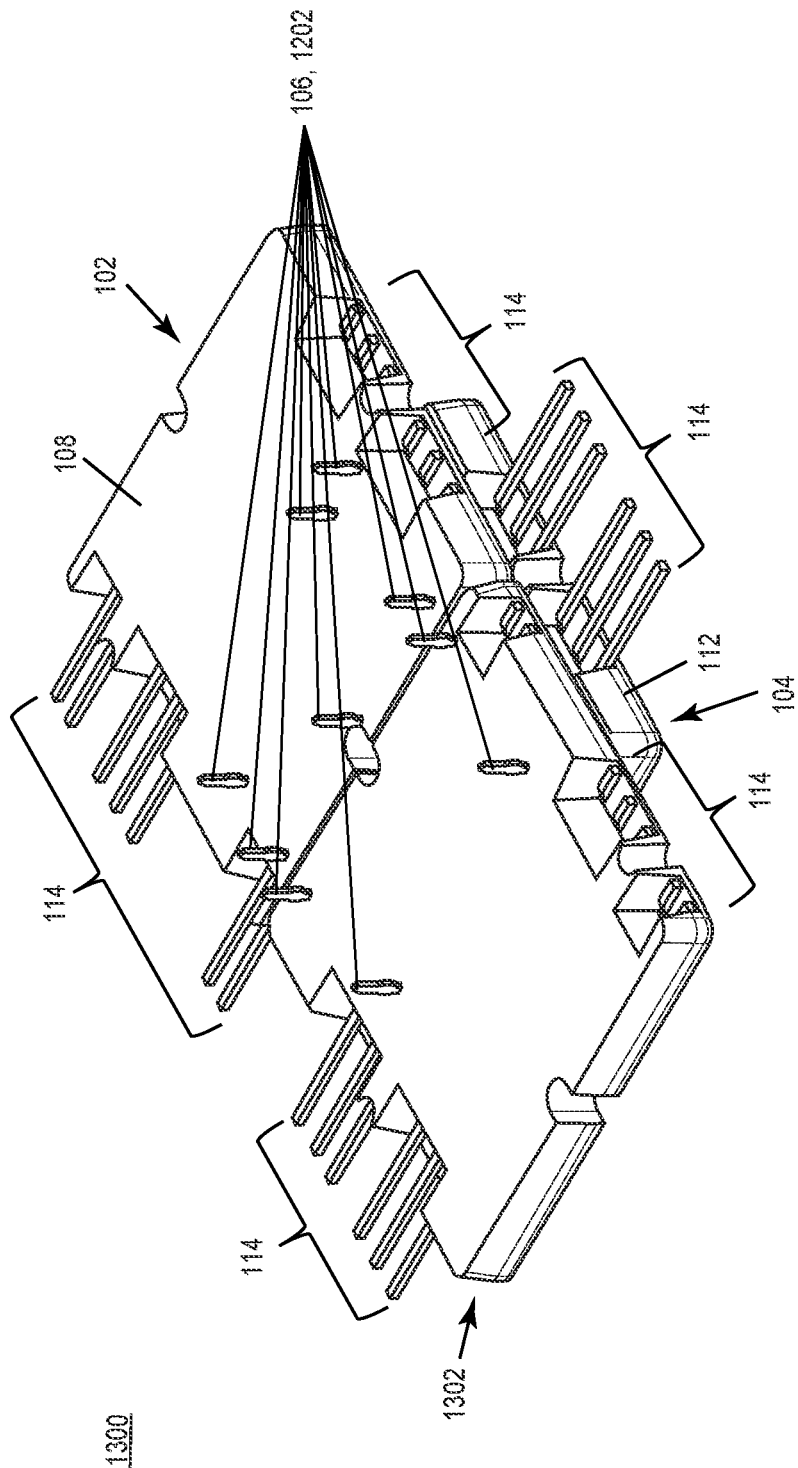
FIG. 13 illustrates a top perspective view of another embodiment of a stacked module arrangement.

FIG. 13 illustrates another embodiment of a stacked module arrangement 1300. The embodiment illustrated in FIG. 13 is similar to the embodiment illustrated in FIG. 12. In FIG. 13, a third molded electronic module 1302 physically and electrically connected to the second molded electronic module 104 in a stacked configuration via the same interface that physically and electrically connects the first molded electronic module 102 to the second molded electronic module 104 in the same stacked configuration. The third molded electronic module 1302 is disposed over the part of the second molded electronic module 104 not covered by the first molded electronic module 102 such that the first and third molded electronic modules 102, 1302 may be coplanar if the first and third molded electronic modules 104, 1302 are of the same module type.

In one embodiment, the third molded electronic module 1302 is a power electronic module having a maximum breakdown voltage of at least 40V and a maximum DC current of at least 10 A and the vertical (stacked) interface physically and electrically connects the third molded electronic module 1302 and the second molded electronic module 104 to one another as part of the stacked configuration. For example, the first molded electronic module 102 may include a single power switch die, the third molded electronic module 1302 may include a single power switch die, the single power switch die included in the first molded electronic module 102 and the single power switch die included in the third molded electronic module 1302 may be electrically connected in a half-bridge configuration by the vertical (stacked) interface, and the second molded electronic module 104 may be configured to drive both the single switch die included in the first molded electronic module 102 and the single switch die included in the third molded electronic module 1302.

Although the present disclosure is not so limited, the following numbered examples demonstrate one or more aspects of the disclosure.

Example 1. A stacked module arrangement, comprising: a first molded electronic module; a second molded electronic module; and an interface by which the first molded electronic module and the second molded electronic module are physically and electrically connected to one another in a stacked configuration, wherein the first molded electronic module is a power electronic module having a maximum breakdown voltage of at least 40V and a maximum DC current of at least 10 A.

Example 2. The stacked module arrangement of example 1, wherein the interface is a press-fit interface that comprises a plurality of press-fit connectors protruding through a molded body of the first molded electronic module and received by a corresponding plurality of openings in a molded body of the second molded electronic module.

Example 3. The stacked module arrangement of example 2, wherein at least some of the press-fit connectors extend through the molded body of the second molded electronic module to provide a connection interface at a side of the second molded electronic module facing away from the first molded electronic module.

Example 4. The stacked module arrangement of example 3, further comprising one or more bus bars connected to the connection interface.

Example 5. The stacked module arrangement of example 3 or 4, further comprising a circuit board connected to the connection interface.

Example 6. The stacked module arrangement of any of examples 2 through 5, further comprising a circuit board interposed between the first molded electronic module and the second molded electronic module.

Example 7. The stacked module arrangement of example 6, wherein at least some of the press-fit connectors extend through the circuit board and into a molded body of the second molded electronic module.

Example 8. The stacked module arrangement of example 1, wherein the interface comprises a solder joint between leads of the first and molded electronic modules.

Example 9. The stacked module arrangement of any of examples 1 through 8, wherein the second molded electronic module is a power electronic module having a maximum breakdown voltage of at least 40V and a maximum DC current of at least 10 A, and wherein the first molded electronic module and the second molded electronic module form a power converter or inverter circuit.

Example 10. The stacked module arrangement of example 9, further comprising a circuit board and/or a bus bar connected to the interface and interposed between the first molded electronic module and the second molded electronic module.

Example 11. The stacked module arrangement of example 9 or 10, further comprising: a first cooling device thermally coupled to a side of the first molded electronic module facing away from the interface; and a second cooling device thermally coupled to a side of the second molded electronic module facing away from the interface.

Example 12. The stacked module arrangement of any of examples 9 through 11, wherein the first molded electronic module includes a first half-bridge, wherein the second molded electronic module includes a second half-bridge, and wherein the first half-bridge and the second half-bridge are stacked on one another via the interface.

Example 13. The stacked module arrangement of any of examples 1 through 12, wherein the first molded electronic module includes a transistor die, wherein the second molded electronic module includes a diode die, and wherein the interface electrically connects the diode die and the transistor die in an anti-parallel configuration.

Example 14. The stacked module arrangement of any of examples 1 through 12, wherein the first molded electronic module includes a power converter or inverter, and wherein the second molded electronic module includes a controller for the power converter or inverter.

Example 15. The stacked module arrangement of any of examples 1 through 12, wherein the first molded electronic module includes a power converter or inverter, and wherein the second molded electronic module includes a rectifier.

Example 16. The stacked module arrangement of any of examples 1 through 12, wherein the second molded electronic module is a logic module that includes a controller and/or a gate driver for the first molded electronic module.

Example 17. The stacked module arrangement of any pf examples 1 through 16, further comprising one or more circuit boards physically and electrically connected to the interface and interposed between the first molded electronic module and the second molded electronic module.

Example 18. The stacked module arrangement of any of examples 1 through 17, further comprising one or more bus bars connected to the interface and interposed between the first molded electronic module and the second molded electronic module.

Example 19. The stacked module arrangement of any of examples 1 through 18, further comprising a third molded electronic module, wherein the third molded electronic module is a power electronic module having a maximum breakdown voltage of at least 40V and a maximum DC current of at least 10 A, and wherein the interface physically and electrically connects the third molded electronic module and the second molded electronic module to one another as part of the stacked configuration.

Example 20. The stacked module arrangement of example 19, wherein the first molded electronic module includes a single power switch die, wherein the third molded electronic module includes a single power switch die, wherein the single power switch die included in the first molded electronic module and the single power switch die included in the third molded electronic module are electrically connected in a half-bridge configuration by the interface, and wherein the second molded electronic module is configured to drive both the single switch die included in the first molded electronic module and the single switch die included in the third molded electronic module.

Example 21. The stacked module arrangement of any of examples 1 through 20, wherein the maximum breakdown voltage is in a range of 750V to 1200V.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A stacked module arrangement, comprising:
   a first molded electronic module;
   a second molded electronic module; and
   an interface by which the first molded electronic module and the second molded electronic module are physically and electrically connected to one another in a stacked configuration,
   wherein the first molded electronic module is a power electronic module having a maximum breakdown voltage of at least 40V and a maximum DC current of at least 10 A, and
   wherein the interface is a press-fit interface that comprises a plurality of press-fit connectors protruding through a molded body of the first molded electronic module and received by a corresponding plurality of openings in a molded body of the second molded electronic module.

2. The stacked module arrangement of claim 1, wherein at least some of the press-fit connectors extend through the molded body of the second molded electronic module to provide a connection interface at a side of the second molded electronic module facing away from the first molded electronic module.

3. The stacked module arrangement of claim 2, further comprising one or more bus bars connected to the connection interface.

4. The stacked module arrangement of claim 2, further comprising a circuit board connected to the connection interface.

5. The stacked module arrangement of claim 1, further comprising a circuit board interposed between the first molded electronic module and the second molded electronic module.

6. The stacked module arrangement of claim 5, wherein at least some of the press-fit connectors extend through the circuit board and into a molded body of the second molded electronic module.

7. The stacked module arrangement of claim 1, wherein the interface comprises a solder joint between leads of the first and molded electronic modules.

8. The stacked module arrangement of claim 1, wherein the second molded electronic module is a power electronic module having a maximum breakdown voltage of at least 40V and a maximum DC current of at least 10 A, and wherein the first molded electronic module and the second molded electronic module form a power converter or inverter circuit.

9. The stacked module arrangement of claim 8, further comprising a circuit board and/or a bus bar connected to the interface and interposed between the first molded electronic module and the second molded electronic module.

10. The stacked module arrangement of claim 8, further comprising:
    a first cooling device thermally coupled to a side of the first molded electronic module facing away from the interface; and
    a second cooling device thermally coupled to a side of the second molded electronic module facing away from the interface.

11. The stacked module arrangement of claim 8, wherein the first molded electronic module includes a first half-bridge, wherein the second molded electronic module includes a second half-bridge, and wherein the first half-bridge and the second half-bridge are stacked on one another via the interface.

12. The stacked module arrangement of claim 1, wherein the first molded electronic module includes a transistor die, wherein the second molded electronic module includes a diode die, and wherein the interface electrically connects the diode die and the transistor die in an anti-parallel configuration.

13. The stacked module arrangement of claim 1, wherein the first molded electronic module includes a power converter or inverter, and wherein the second molded electronic module includes a controller for the power converter or inverter.

14. The stacked module arrangement of claim 1, wherein the first molded electronic module includes a power converter or inverter, and wherein the second molded electronic module includes a rectifier.

15. The stacked module arrangement of claim 1, wherein the second molded electronic module is a logic module that includes a controller and/or a gate driver for the first molded electronic module.

16. The stacked module arrangement of claim 1, further comprising one or more circuit boards physically and electrically connected to the interface and interposed between the first molded electronic module and the second molded electronic module.

17. The stacked module arrangement of claim 1, further comprising one or more bus bars connected to the interface and interposed between the first molded electronic module and the second molded electronic module.

18. The stacked module arrangement of claim 1, further comprising a third molded electronic module, wherein the third molded electronic module is a power electronic module having a maximum breakdown voltage of at least 40V and a maximum DC current of at least 10 A, and wherein the interface physically and electrically connects the third molded electronic module and the second molded electronic module to one another as part of the stacked configuration.

19. The stacked module arrangement of claim 18, wherein the first molded electronic module includes a single power switch die, wherein the third molded electronic module includes a single power switch die, wherein the single power switch die included in the first molded electronic module and the single power switch die included in the third molded electronic module are electrically connected in a half-bridge configuration by the interface, and wherein the second molded electronic module is configured to drive both the single switch die included in the first molded electronic module and the single switch die included in the third molded electronic module.

20. The stacked module arrangement of claim 1, wherein the maximum breakdown voltage is in a range of 750V to 1200V.

* * * * *